(12) United States Patent
Kurihara et al.

(10) Patent No.: US 6,750,520 B2
(45) Date of Patent: Jun. 15, 2004

(54) TWO-BIT SEMICONDUCTOR MEMORY WITH ENHANCED CARRIER TRAPPING

(75) Inventors: Hideo Kurihara, Kawasaki (JP); Mitsuteru Iijima, Kawasaki (JP); Kiyoshi Itano, Kawasaki (JP); Tetsuya Chida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/085,023

(22) Filed: Mar. 1, 2002

(65) Prior Publication Data

US 2002/0084484 A1 Jul. 4, 2002

Related U.S. Application Data

(63) Continuation of application No. PCT/JP00/03468, filed on May 30, 2000, now abandoned.

(30) Foreign Application Priority Data

Sep. 3, 1999 (JP) ............................................ 11-250780

(51) Int. Cl.[7] .............................................. H01L 29/76
(52) U.S. Cl. ...................... 257/410; 257/288; 257/327; 257/329; 257/345; 257/411; 438/216; 438/261; 438/421; 438/591; 438/595
(58) Field of Search ................................ 257/288, 327, 257/329, 345, 410, 411, 349, E29.309; 438/216, 261, 421, 591, 595, 287, 954, 981

(56) References Cited

U.S. PATENT DOCUMENTS

| | | | | |
|---|---|---|---|---|
| 5,143,860 A | | 9/1992 | Mitchell et al. | ............. 438/262 |
| 5,768,192 A | * | 6/1998 | Eitan | ..................... 365/185.24 |
| 5,796,140 A | * | 8/1998 | Tomioka | ..................... 257/316 |
| 5,812,449 A | | 9/1998 | Song | ..................... 365/185.03 |

FOREIGN PATENT DOCUMENTS

| | | |
|---|---|---|
| JP | 48-073086 | 10/1973 |
| JP | 56-32464 | 3/1981 |
| JP | 60-161674 | 8/1985 |
| JP | 5-145080 | 6/1993 |
| WO | WO 99/07000 | 2/1999 |

* cited by examiner

*Primary Examiner*—Nathan J. Flynn
*Assistant Examiner*—Scott R. Wilson
(74) *Attorney, Agent, or Firm*—Westerman, Hattori, Daniels & Adrian, LLP

(57) ABSTRACT

A nonvolatile semiconductor memory comprises a pair of diffused layers formed in the surface area of a p-type silicon substrate, and a gate electrode (polysilicon film and tungsten silicide film formed on a gate oxide between the diffused layers over the p-type silicon substrate. Silicon nitride film is formed at both ends of the gate oxide so that the carrier trap characteristic may become high locally in areas near the pair of diffused layer. This configuration prevents carrier injection to other than the ends of the gate oxide, ensures reliable recording and storage, and increases reliability by preventing write and erase error.

6 Claims, 8 Drawing Sheets

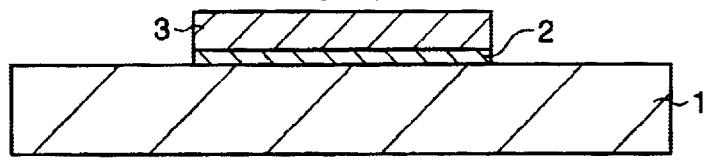
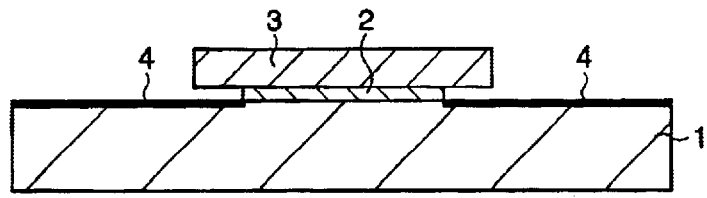
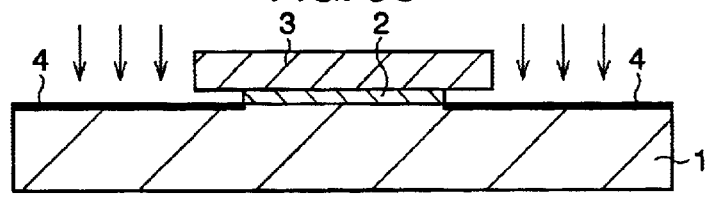
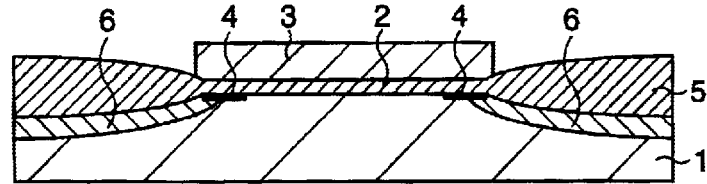
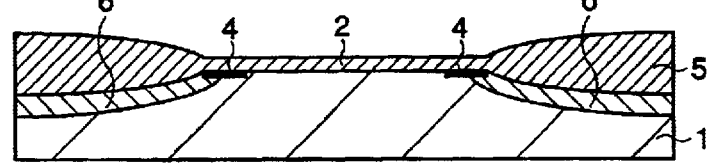
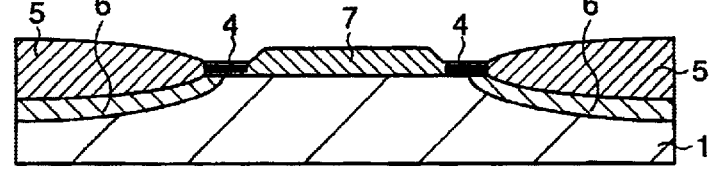
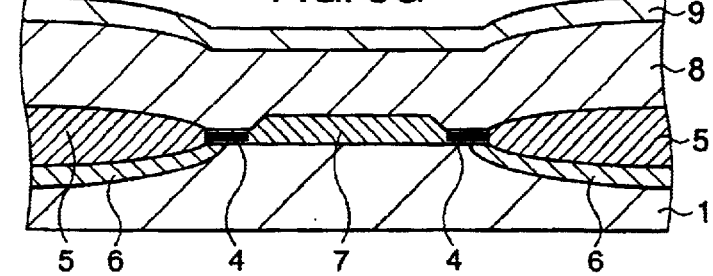

TWO-BIT SEMICONDUCTOR MEMORY WITH ENHANCED CARRIER TRAPPING

CROSS-REFERENCE TO RELATED APPLICATIONS

This is a continuation of Application PCT/JP00/03468, filed May 30, 2000, now abandoned.

TECHNICAL FIELD

The present invention relates to a semiconductor memory and a method of manufacture thereof and, more particularly, to a nonvolatile semiconductor memory capable of recording 2-bit information in one memory cell.

BACKGROUND ART

Recently, nonvolatile semiconductor memories capable of recording 2-bit information in one memory cell by changing a carrier injection position have been studied and developed. This nonvolatile semiconductor memory traps carriers in a charge trap film formed below the gate. The direction of a voltage applied between the source and the drain is reversed between write and read of information. Electrons are independently trapped in the charge trap film at positions corresponding to the two ends of the channel region. Two-bit information can be recorded depending on whether electrons are trapped at the two ends.

For example, WO 99/07000 discloses a nonvolatile semiconductor memory having the above structure. The structure and data write/read of the nonvolatile semiconductor memory disclosed in this reference will be briefly described with reference to FIG. 8.

As shown in FIG. 8, a nonvolatile semiconductor memory 100 is constituted by a pair of diffused layers 102 and 103 functioning as a source/drain formed in a surface area of a p-type silicon semiconductor substrate 101, a three-layered insulating film formed on the p-type silicon semiconductor substrate 101 between the diffused layers 102 and 103, and a gate electrode 107 formed on the three-layered insulating film. The three-layered insulating film is made up from a gate insulating film (silicon oxide film) 104, charge trap film (silicon nitride film) 105, and silicon oxide film 106.

The nonvolatile semiconductor memory 100 independently traps electrons at positions of the charge trap film that correspond to the two ends of the channel region. The nonvolatile semiconductor memory 100 can record a total of 2-bit information, one bit in RIGHT BIT and another bit LEFT BIT. Information is recorded by injecting electrons into the interface between the gate insulating film 104 and the charge trap film 105. To record information in RIGHT BIT, electrons are injected into an area 109 shown in FIG. 8. To record information in LEFT BIT, electrons are injected into an area 108.

To write information in RIGHT BIT, e.g., the source and drain are respectively set at 0 V and about 5 V, generating a potential difference between the source and the drain. A high voltage (about 10 V) is applied to the gate 107 to form a channel 110 between the source and the drain. In a range $l_2$ where no channel 110 is formed, an electric field is generated by the potential difference between the source and the drain. In this range $l_2$, channel hot electrons are generated, and electrons are trapped in the area 109.

To read out information from RIGHT BIT, a voltage opposite in direction to the write voltage is applied between the source and the drain. Since electrons are trapped in the area 109, no channel is formed from the diffused layer 103 to the diffused layer 102 below the area 109, and the threshold increases. Thus, no current flows between the source and the drain. When no electron is trapped in the area 109, a channel is formed between the source and the drain to flow a current. In this way, 1-bit information can be recorded in correspondence with whether electrons are trapped or not.

If a voltage in the same direction as that of the write voltage is applied in read while electrons are trapped in the area 109, a channel is formed between the source and the drain, flowing a current. To prevent this, a voltage opposite in direction to the write voltage must be applied between the source and the drain in reading information.

Information can also be written in or read out from LEFT BIT similarly to RIGHT BIT by applying voltages opposite in direction to application voltages for write and read of information in RIGHT BIT.

For example, in writing information in RIGHT BIT, the injection position of channel hot electrons generated to increase the threshold of a memory cell in write varies depending on a voltage applied between the drain 103 and the gate electrode 107. In the above-described conventional structure, electrons must be localized in the area 109, but they are undesirably trapped in the gate insulating film 104 at the cannel center where they should not be injected.

Hot holes injected to decrease the threshold of a memory cell (erase operation) in a high-threshold state (e.g., write state) exhibit a generation mechanism different from that of hot electrons mentioned above. Their injection positions do not always coincide with each other. By repetitive write/erase, either type of charges may remain in the silicon nitride film 105, resulting in a write/erase error.

This problem can be reduced by excessively injecting electrons to increase the threshold and excessively injecting holes to decrease the threshold. Excessive injection of carriers, however, decreases the write/erase speed and degrades the element performance. Excessive injection of carriers applies electrical stress more than necessary to an insulating film. This causes dielectric breakdown over time, which is undesirable in terms of element reliability.

Selecting a method of adjusting voltage application conditions in hole injection in relation to the distribution of the electron injection position does not optimize the hole generation efficiency. This also degrades element characteristics.

The present invention has been made to overcome these drawbacks, and has as its object to provide a semiconductor memory and a method of manufacture thereof that can reliably record and store 2-bit information, suppress generation of a write/erase error, and improve reliability in a semiconductor memory for recording 2-bit information by changing a carrier injection position.

SUMMARY OF THE INVENTION

According to the present invention, there is provided a semiconductor memory comprising a pair of diffused layers formed in a surface area of a semiconductor substrate, and a gate electrode formed on a gate insulating film on the semiconductor substrate between the pair of diffused layers, wherein carriers are trapped in the gate insulating film by applying a predetermined voltage to the gate electrode, and the gate insulating film is formed higher in carrier trap characteristic at positions near the pair of diffused layers than in a remaining area.

According to the present invention, a method of manufacture of a semiconductor memory comprises the first step of sequentially forming first and second insulating films on a semiconductor substrate, the second step of selectively removing and patterning the first and second insulating films, the third step of forming a third insulating film on the semiconductor substrate in a predetermined range from the naked semiconductor substrate to a layer below the second insulating film, the fourth step of introducing impurities into the semiconductor substrate by using the second insulating film as a mask, thereby forming a pair of independent diffused layers in a surface area of the semiconductor substrate at two sides of the second insulating film, the fifth step of leaving the third insulating film formed in the predetermined range below the second insulating layer, and removing the third insulating film in a remaining area to expose the semiconductor substrate, the sixth step of thermally oxidizing the naked semiconductor substrate to form an element isolation film, the seventh step of removing the first and second insulating films to expose the underlying semiconductor substrate and third insulating film, and causing the third insulating film to function as a charge trap film, the eighth step of thermally oxidizing the naked surface of the semiconductor substrate to form a fourth insulating film, and covering upper and lower surfaces of the charge trap film with the fourth insulating film, the ninth step of forming a conductive film on the fourth insulating film, and the 10th step of patterning the conductive film into a gate electrode shape.

According to the present invention, a method of manufacture of a semiconductor memory comprises the steps of forming a first insulating film on a semiconductor substrate, selectively removing the first insulating film to expose the underlying semiconductor substrate, introducing impurities into the naked semiconductor substrate by using the first insulating film as a mask, forming a pair of independent diffused layers in a surface area of the semiconductor substrate at two sides of the first insulating film, forming a second insulating film so as to cover the diffused layers and the first insulating film, removing the second insulating film on the first insulating film to expose the first insulating film, removing the first insulating film to expose the underlying semiconductor substrate, thereby causing an area to function as an active element area, forming a third insulating film on the semiconductor substrate in the active element area, forming a fourth insulating film on the third insulating film, forming a fifth insulating film so as to cover the fourth and second insulating films, removing the fifth insulating film so as to leave it only on two sides of the active element area, thereby forming a side wall of the fifth insulating film on a side wall of the second insulating film and exposing the semiconductor substrate in the active element area, forming a sixth insulating film on the naked semiconductor substrate, removing the side wall to expose the underlying fourth insulating film of the side wall, thereby causing the fourth insulating film to function as a charge trap film, forming a seventh insulating film on the charge trap film, and forming a conductive film so as to cover the sixth and seventh insulating films.

The present invention is realized by the above-described technique means. When hot electrons are generated in data write by applying a high voltage to the gate electrode, electrons are injected to an end having a high carrier trap characteristic more than the center of the channel width. Electrons can therefore be concentratedly trapped at the end of the gate insulating film below the gate electrode. Also in data erase, as hot holes can be concentratedly injected to the end of the gate insulating film, data can be stably erased.

According to the present invention, 2-bit information can be stably, reliably recorded and stored in a semiconductor memory for recording 2-bit information by changing the carrier injection position. Hence, the present invention can provide a semiconductor memory and a method of manufacture thereof that can suppress generation of a write/erase error and improve the reliability.

BRIEF DESCRIPTION OF DRAWINGS

FIGS. 5A to 5G are schematic sectional views, respectively, showing the steps in manufacturing a nonvolatile semiconductor memory according to the second embodiment of the present invention;

DETAILED DESCRIPTION OF THE PREFERRED EMBODIMENTS

The structure and manufacture method of a nonvolatile semiconductor memory according to embodiments of the present invention will be described with reference to the accompanying drawings.

(First Embodiment)

Figure 1A:
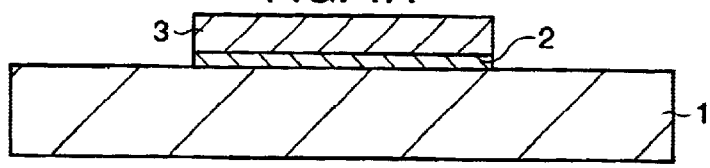
FIGS. 1A to 1G are schematic sectional views, respectively, showing the steps in manufacturing a nonvolatile semiconductor memory according to the first embodiment of the present invention.
Figure 2:
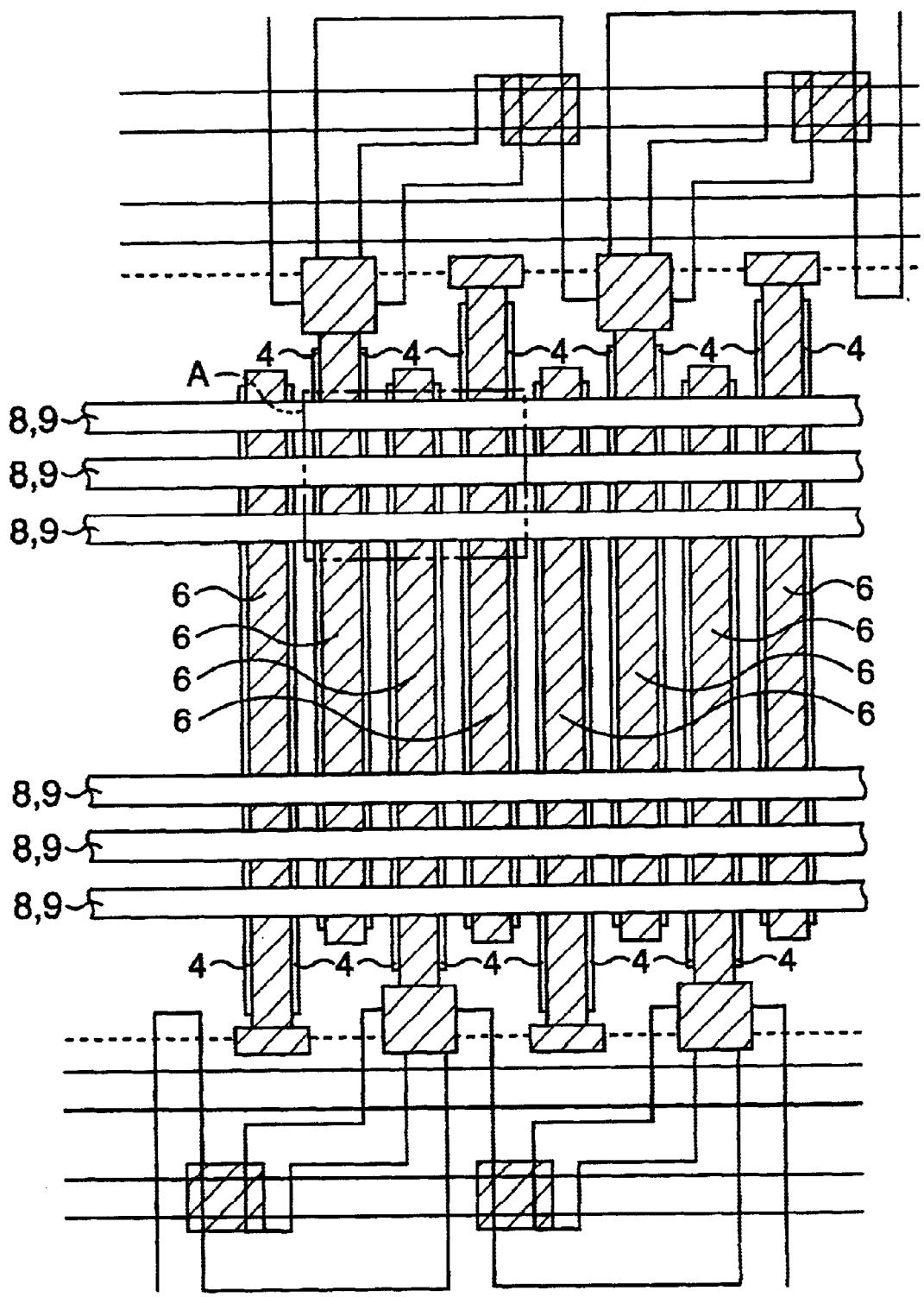
FIG. 2 is a schematic plan view showing the planar arrangement of the nonvolatile semiconductor memory according to each embodiment of the present invention.
Figure 3:
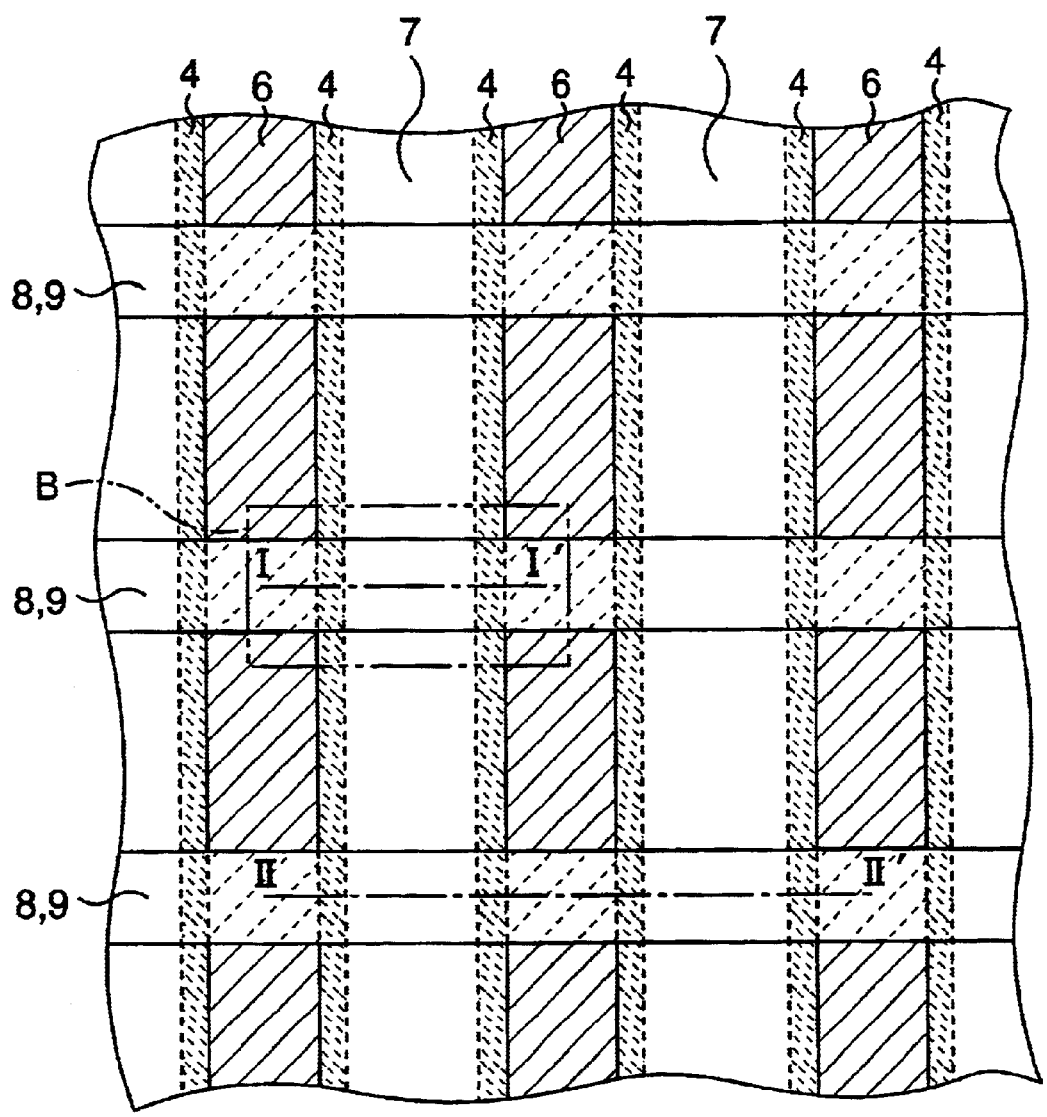
FIG. 3 is a schematic plan view showing in detail the planar arrangement of the nonvolatile semiconductor memory according to each embodiment of the present invention.

A first embodiment will be explained. FIGS. 1A to 1G are schematic sectional views, each of which shows the gradual step in manufacturing a nonvolatile semiconductor memory according to the first embodiment. FIGS. 2 and 3 are schematic plan views showing the planar arrangement of the nonvolatile semiconductor memory according to the first embodiment. Each of FIGS. 1A to 1G depicts one memory cell in the nonvolatile semiconductor memory, and shows the section of its memory cell in the manufacture process order. FIGS. 1A to 1G each show sectional views taken along the one-dotted line I–I' in FIG. 3.

A predetermined well is formed on a p-type silicon substrate 1, and a peripheral circuit area is isolated (not shown). As shown in FIG. 1A, a silicon oxide film 2 is grown to a film thickness of about 20 nm by thermal oxidation in a memory cell area. A silicon nitride film 3 is further deposited, on the silicon oxide film 2, to a film thickness of about 200 nm by CVD.

The silicon nitride film 3 and silicon oxide film 2 are left at a portion on the p-type silicon substrate 1 where they serve as the channel region within the memory, and then the rest of the silicon nitride film 3 and silicon oxide film 2 are removed by photolithography and subsequent etching.

Figure 1B:
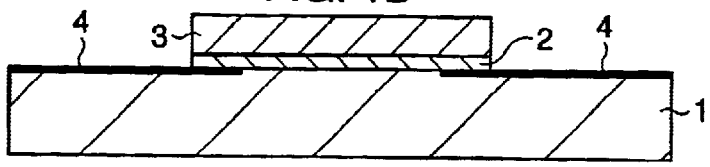

As shown in FIG. 1B, the p-type silicon substrate 1 is annealed in an ammonia (NH$_3$) gas atmosphere at a temperature of about 950° C. for about 20 min to 120 min, thereby forming silicon nitride films 4 in the prescribed range that spreads throughout the naked surface of the p-type silicon substrate 1 and further reaches to a certain segment below the silicon nitride film 3. Each of the silicon nitride films 4 is formed on the naked p-type silicon substrate 1 by a direct reaction between silicon and ammonia gas. The silicon nitride film 4 is also formed at the certain segment below the silicon nitride film 3 because of reaction with ammonia diffused from the silicon oxide film 2. By arranging the formation conditions when the silicon nitride film 4 is formed, the width of the silicon nitride film 4 formed below the segment of the silicon nitride film 3 can be naturally controlled, if necessary.

The silicon nitride film 4 can be formed by the ion implantation. In this case, ions containing nitrogen (N$_2$) and the like are implanted, for example, at an acceleration energy of about 30 keV and a dose of about $1 \times 10^{16}$ (ions/cm$^2$), and then the p-type silicon substrate 1 is annealed to form a nitrogen-containing film near the surface of the p-type silicon substrate 1. The expected width of the silicon nitride film 4 formed below the certain segment of the silicon nitride film 3 can be also naturally obtained by controlling an ion implantation angle to the p-type silicon substrate 1.

Figure 1C:
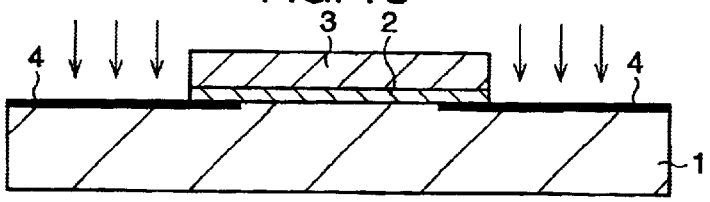

Next, ions are implanted, as shown in FIG. 1C, in the surface area of the p-type silicon substrate 1 by utilizing the silicon nitride film 3 as a mask. More specifically, arsenic (As) as n-type impurities is ion-implanted at an acceleration energy of about 50 keV and a dose of $1 \times 10^{16}$ (ions/cm$^2$). The ion-implanted impurities become a pair of diffused layers 6 functioning as a source/drain in the surface area of the p-type silicon substrate 1 on the two sides of the silicon nitride film 3. In this first embodiment, the diffused layers 6 function as bit lines. For this purpose, as shown in FIG. 2, a plurality of diffused layers 6 are so formed as to extend in a certain direction, and are connected to the related memory cells.

Figure 1D:
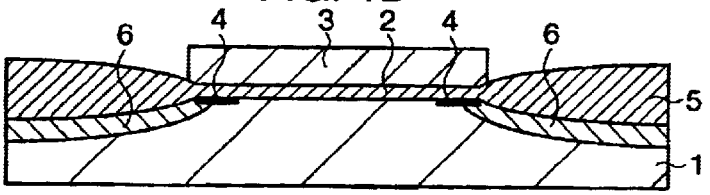

As shown in FIG. 1D, the surface of the p-type silicon substrate 1 is partially thermally oxidized by utilizing the silicon nitride film 3 as a mask. Since the oxidation resistance of the silicon nitride film 4 in the arsenic-implanted area has been lost by the ion implantation in the step of FIG. 1C, the surface of the p-type silicon substrate 1 other than the surface below the silicon nitride film 3 is thermally oxidized in the step shown in FIG. 1D, and silicon oxide films 5 grow as so-called LOCOS (Local Oxidation of Silicon) element isolation. The silicon oxide films 5 demarcate an active element area on the p-type silicon substrate 1.

Figure 1E:
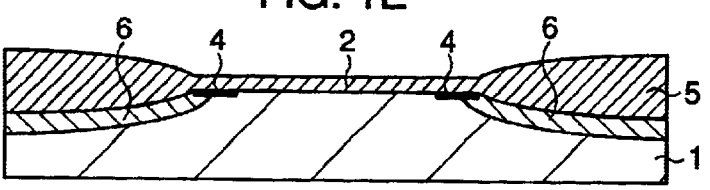

As shown in FIG. 1E, the p-type silicon substrate 1 is dipped in a phosphoric acid solution at a temperature of about 150° C., dissolving the silicon nitride film 3 to thereby remove the same. The silicon nitride films 4 formed below the silicon nitride film 3 are not removed by phosphoric acid but remain below the silicon oxide film 2 because the upper surfaces of the silicon nitride films 4 are covered and protected by the silicon oxide film 2.

Figure 1F:
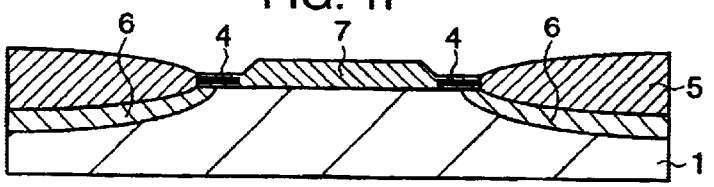

As shown in FIG. 1F, the silicon oxide film 2 on the p-type silicon substrate 1 is removed by being dipped in a hydrofluoric acid (HF) solution. The p-type silicon substrate 1 is subsequently thermally oxidized in order to form a silicon oxide film 7 as a gate insulating film with having a film thickness of about 15 nm. At the portions where the silicon nitride films 4 are formed, the action of the silicon nitride films 4 decreases the oxidation speed of thermal oxidation. Thus, the silicon oxide film 7 which belongs to these portions is formed thinner than the other area. By this thermal oxidation, the silicon nitride films 4 are covered with the silicon oxide film 7. The expected gate insulating film with a structure including the silicon nitride films 4 in the silicon oxide film 7 is formed on the p-type silicon substrate 1 near the pair of diffused layers 6.

The silicon nitride film 4 exhibits a high carrier trap characteristic than that of the silicon oxide film 7. Since the silicon nitride film 4 is included in part of the silicon oxide film 7 functioning as a gate insulating film, the carrier trap characteristic at this portion can be improved in comparison with the remaining area of the silicon oxide film 7. In other words, by forming the silicon nitride film 4 at each end of the silicon oxide film 7, a gate insulating film can be formed with a smaller film thickness in electrical capacitance conversion at the end of the channel region than the film thickness near the center of the channel region. In an area where no silicon nitride film 4 is formed, the silicon oxide film 7 is made thicker than in the area where the silicon nitride film 4 is formed. This suppresses carrier trap in the gate oxide film 7 when a voltage is applied to a gate electrode formed on the top thereof. Hence, the carrier trap characteristic is improved at the end of the channel region than near the center of the channel region.

Figure 1G:
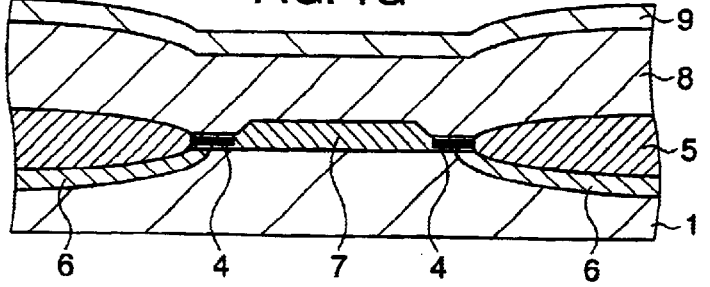

As shown in FIG. 1G, a polysilicon film 8 in which phosphorus (P) is introduced by CVD is formed on the entire surface of the p-type silicon substrate 1. A tungsten silicide film 9 is deposited to a film thickness of about 100 nm on the polysilicon film 8 by CVD. The polysilicon film 8 and the tungsten silicide film 9 are patterned into a gate electrode shape by photolithography and subsequent dry etching. As a result, a gate electrode with a polycide structure of the polysilicon film 8 and the tungsten silicide film 9 is formed. By these steps, the source/drain diffused layers (diffused layers 6), the gate insulating film (silicon oxide film 7 and silicon nitride films 4), and the gate electrode (polysilicon film 8 and tungsten silicide film 9) are prepared as the main part of a transistor.

After that, a general wiring layer formation step is performed to complete a nonvolatile semiconductor memory according to the first embodiment. More specifically, an insulating interlayer (silicon oxide film or the like) is deposited by CVD to cover the gate electrode made up from the polysilicon film 8 and tungsten silicide film 9. A contact hole is formed in the insulating interlayer by photolithography and subsequent dry etching. For example, an aluminum film is sputtered as a wiring layer on the insulating interlayer to fill the contact hole. The aluminum film is patterned into a predetermined shape by photolithography and subsequent dry etching. A protective film is so formed as to cover the aluminum film.

FIG. 2 is a plan view showing the planar arrangement of the completed nonvolatile semiconductor memory according to the first embodiment. The insulating interlayer and aluminum film on the gate electrode are not illustrated. As shown in FIG. 2, a plurality of gate electrodes (polysilicon film 8 and tungsten silicide film 9) are aligned so as to be perpendicular to a plurality of diffused layers 6.

FIG. 3 is a schematic enlarged view showing an area A surrounded by the two-dotted line in FIG. 2. The silicon oxide films 5 serving as an element isolation film is not illustrated. In FIG. 3, an area surrounded by a chain two-dotted line B constitutes one memory cell. As shown in FIG. 3, the silicon nitride films 4 are formed along the two sides of each diffused layer 6 so as to oppose other silicon nitride films 4 along other diffused layers 6 with the silicon oxide films 7 being interposed. Data can be written/erased such that a gate electrode corresponding to a selected memory cell is set to a high potential and a potential difference is applied between the diffused layers 6 on the two sides of the memory cell.

Figure 4A:
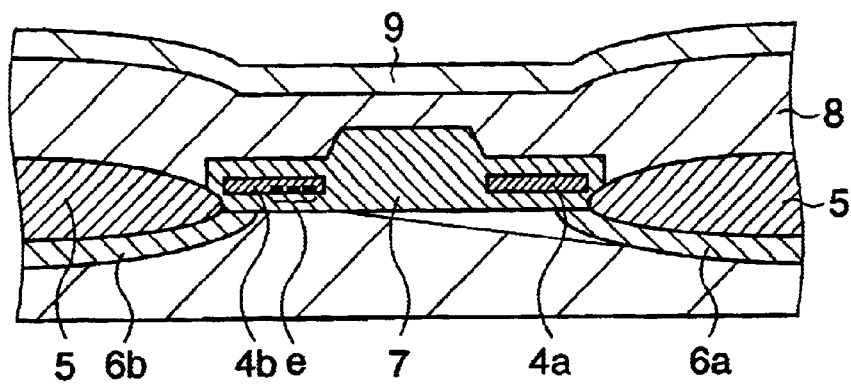
FIGS. 4A and 4B are schematic sectional views showing write/read in/from the nonvolatile semiconductor memory according to each embodiment of the present invention.
Figure 4B:
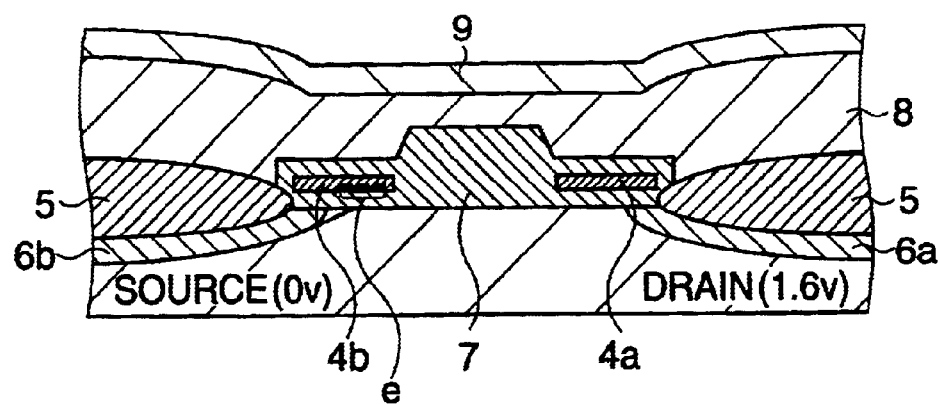

FIGS. 4A and 4B are schematic views showing data write and read operations. To write data, as shown in FIG. 4A, a diffused layer 6a on the right is grounded as a source, and a diffused layer 6b on the left as a drain receives a voltage of about 5 V. By applying a high voltage (about 10 V) to the gate electrode, hot electrons are generated near the drain (diffused layer 6b), and electrons e are trapped by a silicon nitride film 4b. Since the silicon nitride film 4b which traps electrons e is formed only near the drain and is not formed near the center of the channel width, electrons e are trapped only in the area where the silicon nitride film 4b is formed. This can suppress trap of the electrons e other than the area where the silicon nitride film 4b is formed, and can improve the reliability of data write.

To erase data, the diffused layer 6a is released, and the diffused layer 6b as a drain receives a voltage of about 5 V. By applying a negative voltage (about −5 V) to the gate electrode, hot holes are generated near the drain (diffused layer 6b), and holes are trapped by the silicon nitride film 4b. Since the silicon nitride film 4b which traps holes is formed only near the drain and is not formed near the center of the channel width, these holes are trapped only in the area where the silicon nitride film 4b is formed. The trapped electrons e can be surely erased. This can improve the reliability of data erase.

To read out data, as shown in FIG. 4B, the diffused layer 6b is grounded as a source, and the diffused layer 6a as a drain receives a voltage of about 1.6 V. When the electrons e are trapped in the silicon nitride film 4b, the channel disappears owing to a negative electric field generated by the trapped electrons e. The threshold increases, and no current flows between the diffused layers 6a and 6b. When no electron e is trapped in the silicon nitride film 4b, the channel does not disappear, and a current flows between the diffused layers 6a and 6b. Therefore, 1-bit information can be stored in correspondence with whether electrons e are trapped in the silicon nitride film 4b.

Data is written in or read out from a silicon nitride film 4a by applying a voltage opposite in direction to a data write/read voltage to the silicon nitride film 4b. As a result, 2-bit information can be recorded in the silicon nitride films 4a and 4b.

As described above, according to the first embodiment of the present invention, the silicon nitride films 4 with a high carrier trap characteristic are formed at the two ends of the gate oxide film 7. This structure limits a charge injection portion, and carriers can be reliably trapped only near the silicon nitride films 4. When the gate electrode (polysilicon film 8 and tungsten silicide film 9) is set to a high potential and a potential difference is applied between the pair of diffused layers 6 in recording information, electrons can be securely trapped near the silicon nitride film 4, and trap of electrons in another area can be suppressed without any influence of variations in the potential of the gate electrode or the potential difference between the pair of diffused layers 6. Also in erasing data, holes can be trapped near the silicon nitride film 4, and trap of holes in another area can be suppressed. Accordingly, data can be stably, reliably recorded and erased by injecting a minimum amount of carriers.

(Second Embodiment)

A second embodiment of the present invention will be explained. FIGS. 5A to 5G are schematic sectional views, each of which shows the gradual step in manufacturing a nonvolatile semiconductor memory according to the second embodiment. The planar arrangement of the nonvolatile semiconductor memory according to the second embodiment is the same as that of the nonvolatile semiconductor memory according to the first embodiment shown in FIGS. 2 and 3. FIGS. 5A to 5G depict one memory cell in the nonvolatile semiconductor memory, each showing the section of the memory cell in the manufacture process order. Similar to the first embodiment, FIGS. 5A to 5G show sectional views taken along the chain line I–I' in FIG. 3. In FIGS. 5A to 5G, the same reference numerals as in FIG. 1 of the first embodiment denote the same parts.

A predetermined well is formed in a p-type silicon substrate 1, and a peripheral circuit area is isolated (not shown). As shown in FIG. 5A, a silicon oxide film 2 is grown to a film thickness of about 20 nm by thermal oxidation in a memory cell area. A silicon nitride film 3 is deposited to a film thickness of about 200 nm by CVD on the silicon oxide film 2.

The silicon nitride film 3 and silicon oxide film 2 are left at a portion on the p-type silicon substrate 1 where they serve as the channel region within the memory, and then the rest of the silicon nitride film 3 and silicon oxide film 2 are removed by photolithography and subsequent etching.

As shown in FIG. 5B, the p-type silicon substrate 1 is dipped in a hydrofluoric acid (HF) solution to wet-etch the silicon oxide film 2 by about 50 nm in the direction of lateral width. By this etching, the silicon oxide film 2 becomes narrower than the silicon nitride film 3. The p-type silicon substrate 1 is annealed in an ammonia ($NH_3$) gas atmosphere at a temperature of about 950° C. for about 20 min to 120 min, thereby forming silicon nitride films 4 from the surface of the naked p-type silicon substrate 1 to the pattern ends of the silicon oxide film 2 below the certain segment of the silicon nitride film 3. Since the silicon oxide film 2 is etched in the direction of lateral width, as described above, the silicon nitride films 4 can be securely formed on the surface area of the p-type silicon substrate 11 below the segments of the silicon nitride film 3. By controlling the removal amount of the silicon oxide film 2, the lateral width of the silicon nitride film 4 below the silicon nitride film 3 can be adjusted with high precision.

The silicon nitride film 4 can be formed by ion implantation. In this case, ions containing nitrogen ($N_2$) and the like are implanted at an acceleration energy of about 30 keV and a dose of about $1 \times 10^{16}$ (ions/$cm^2$), and the p-type silicon substrate 1 is annealed to form a nitrogen-containing film near the surface of the p-type silicon substrate 1. At this time, the width of the silicon nitride film 4 formed below the silicon nitride film 3 can be controlled by controlling the ion implantation angle to the p-type silicon substrate 1.

As shown in FIG. 5C, ions are implanted in the surface area of the p-type silicon substrate 1 by utilizing the silicon nitride film 3 as a mask. More specifically, arsenic (As) as n-type impurities is ion-implanted at an acceleration energy of about 50 keV and a dose of $1 \times 10^{16}$ (ions/$cm^2$). The ion-implanted impurities form a pair of diffused layers 6 functioning as a source/drain in the surface area of the p-type silicon substrate 1 on the two sides of the silicon nitride film 3. Since the diffused layers 6 function as bit lines, a plurality of diffused layers 6 are so formed as to extend in a predetermined direction, and are connected to respective memory cells, as shown in FIG. 2.

As shown in FIG. 5D, the surface of the p-type silicon substrate 1 is selectively thermally oxidized by using the silicon nitride film 3 as a mask. Since the oxidation resistance of the silicon nitride film 4 in the arsenic-implanted area has been lost by ion implantation in the step of FIG. 5C, the surface of the p-type silicon substrate 1 other than the surface below the silicon nitride film 3 is thermally oxidized in the step shown in FIG. 5D, and silicon oxide films 5 grow as so-called LOCOS element isolation. The silicon oxide films 5 demarcate an active element area on the p-type silicon substrate 1.

As shown in FIG. 5E, the p-type silicon substrate 1 is dipped in a phosphoric acid solution at a temperature of about 150° C., dissolving and removing the silicon nitride film 3. The silicon nitride films 4 formed below the silicon nitride film 3 are not removed by phosphoric acid and remain below the silicon oxide film 2 because the upper surfaces of the silicon nitride films 4 are covered and protected by the silicon oxide film 2.

As shown in FIG. 5F, the silicon oxide film 2 on the p-type silicon substrate 1 is removed by being dipped in a hydrofluoric acid (HF) solution. The p-type silicon substrate 1 is thermally oxidized to form a silicon oxide film 7 having a film thickness of about 15 nm as a gate insulating film. At the portion where the silicon nitride film 4 is formed, the silicon nitride film 4 decreases the oxidation speed of thermal oxidation. Thus, the silicon oxide film 7 at this portion is formed thinner than in the remaining area. By this thermal oxidation, the silicon nitride films 4 are covered with the silicon oxide film 7. A gate insulating film with a structure including the silicon nitride films 4 in the silicon oxide film 7 is formed on the p-type silicon substrate 1 near the pair of diffused layers 6.

The silicon nitride film 4 exhibits a high carrier trap characteristic than that of the silicon oxide film 7. Since the silicon nitride film 4 is included in part of the silicon oxide film 7 functioning as a gate insulating film, similar to the first embodiment, the carrier trap characteristic at this portion can be improved in comparison with the remaining area of the silicon oxide film 7. In an area where no silicon nitride film 4 is formed, the silicon oxide film 7 is made thicker than in the area where the silicon nitride film 4 is formed. This suppresses carrier trap in the gate oxide film 7 when a voltage is applied to a gate electrode formed on the top. Hence, the carrier trap characteristic becomes higher at the end of the channel region than near the center of the channel region.

As shown in FIG. 5G, a polysilicon film 8 in which phosphorus (P) is introduced by CVD is formed on the entire surface of the p-type silicon substrate 1. A tungsten silicide film 9 is deposited to a film thickness of about 100 nm on the polysilicon film 8 by CVD. The polysilicon film 8 and tungsten silicide film 9 are patterned into a gate electrode shape by photolithography and subsequent dry etching. As a result, a gate electrode with a polycide structure of the polysilicon film 8 and tungsten silicide film 9 is formed. By these steps, the source/drain diffused layers (diffused layers 6), gate insulating film (silicon oxide film 7 and silicon nitride film 4), and gate electrode (polysilicon film 8 and tungsten silicide film 9) are completed as the main part of a transistor.

After that, a general wiring layer formation step is performed to complete a nonvolatile semiconductor memory according to the second embodiment. More specifically, an insulating interlayer (silicon oxide film or the like) is deposited by CVD to cover the gate electrode made up of the polysilicon film 8 and tungsten silicide film 9. A contact hole is formed in the insulating interlayer by photolithography and subsequent dry etching. For example, an aluminum film is sputtered as a wiring layer on the insulating interlayer to fill the contact hole. The aluminum film is patterned into a predetermined shape by photolithography and subsequent dry etching. A protective film is so formed as to cover the aluminum film.

As described above, according to the second embodiment of the present invention, similar to the first embodiment, the silicon nitride films 4 with a high carrier trap characteristic are formed at the two ends of the gate oxide film 7. This structure limits a charge injection portion, and carriers can be reliably trapped only near the silicon nitride films 4. In the second embodiment, the two ends of the silicon oxide film 2 are removed by a predetermined amount in formation of the silicon nitride films 4 such that the silicon oxide film 2 becomes narrower than the silicon nitride film 3. The silicon nitride films 4 can be reliably formed in the removed area. By controlling the removal amount of the silicon oxide film 2, the width of the silicon nitride film 4 below the gate electrode can be adjusted with high precision.

(Third Embodiment)

A third embodiment of the present invention will be explained. FIGS. 6A to 6G are schematic sectional views, each of which shows the gradual step in manufacturing a nonvolatile semiconductor memory according to the third embodiment. The planar arrangement of the nonvolatile semiconductor memory according to the second embodiment is the same as that of the nonvolatile semiconductor memory according to the first embodiment shown in FIGS. 2 and 3. FIGS. 6A to 6G depict one memory cell in the nonvolatile semiconductor memory, each showing the section of the memory cell in the manufacture process order. Similar to the first embodiment, FIGS. 6A to 6G show sectional views taken along the chain line I–I' in FIG. 3. In FIGS. 6A to 6G, the same reference numerals as in FIGS. 1A to 1G of the first embodiment denote the same parts.

Figure 6A:
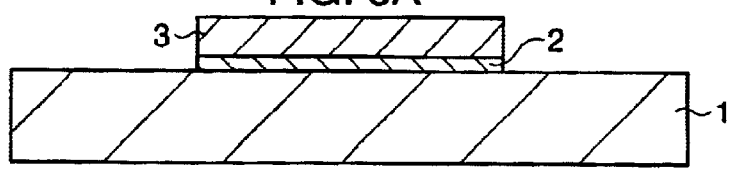
FIGS. 6A to 6G are schematic sectional views, respectively, showing the steps in manufacturing a nonvolatile semiconductor memory according to the third embodiment of the present invention.

A predetermined well is formed in a p-type silicon substrate 1, and a peripheral circuit area is isolated (not shown). As shown in FIG. 6A, a silicon oxide film 2 is grown to a film thickness of about 20 nm by thermal oxidation in a memory cell area. A silicon nitride film 3 is deposited to a film thickness of about 200 nm by CVD on the silicon oxide film 2.

The silicon nitride film 3 and silicon oxide film 2 are left at a portion on the p-type silicon substrate 1 where they serve as the channel region within the memory, and then the rest of the silicon nitride film 3 and silicon oxide film 2 are removed by photolithography and subsequent etching.

Figure 6B:
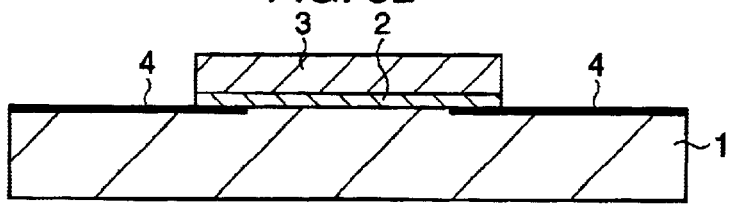

As shown in FIG. 6B, the p-type silicon substrate 1 is annealed in an ammonia ($NH_3$) gas atmosphere at a temperature of about 950° C. for about 20 min to 120 min, thereby forming silicon nitride films 4 in the prescribed range that spreads throughout the naked surface of the p-type silicon substrate 1 and further reaches to a certain segment below the silicon nitride film 3. Each silicon nitride film 4 is formed on the naked p-type silicon substrate 1 by direct reaction between silicon and ammonia gas. The silicon nitride film 4 is formed below the silicon nitride film 3 because of reaction with ammonia diffused from the silicon oxide film 2. By controlling the film formation conditions of the silicon nitride film 4, the width of the silicon nitride film 4 formed below the silicon nitride film 3 can be controlled.

The silicon nitride film 4 may be formed by ion implantation. In this case, ions containing nitrogen ($N_2$) or the like are implanted at an acceleration energy of about 30 keV and a dose of about $1 \times 10^{16}$ (ions/cm$^2$), and the p-type silicon substrate 1 is annealed to form a nitrogen-containing film near the surface of the p-type silicon substrate 1. At this time, the width of the silicon nitride film 4 formed below the silicon nitride film 3 can be controlled by controlling the ion implantation angle to the p-type silicon substrate 1.

Figure 6C:
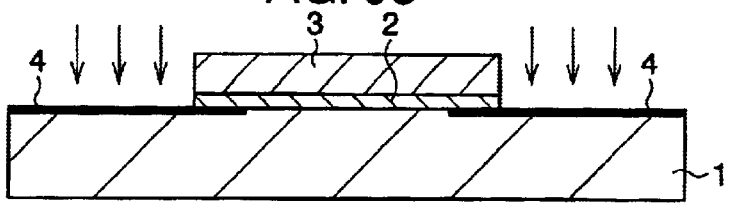

As shown in FIG. 6C, ions are implanted in the surface area of the p-type silicon substrate 1 by using the silicon nitride film 3 as a mask. More specifically, arsenic (As) as n-type impurities is ion-implanted at an acceleration energy of about 50 keV and a dose of $1 \times 10^{16}$ (ions/cm$^2$). The ion-implanted impurities form a pair of diffused layers 6 functioning as a source/drain in the surface area of the p-type silicon substrate 1 on the two sides of the silicon nitride film 3. Since the diffused layers 6 function as bit lines, a plurality of diffused layers 6 are so formed as to extend in a predetermined direction, and are connected to respective memory cells, as shown in FIG. 2.

Figure 6D:
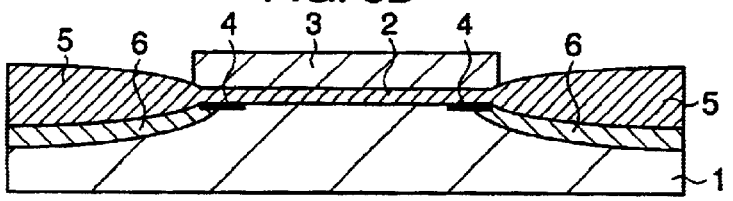

As shown in FIG. 6D, the surface of the p-type silicon substrate 1 is selectively thermally oxidized by using the silicon nitride film 3 as a mask. Since the oxidation resistance of the silicon nitride film 4 in the arsenic-implanted area has been lost by ion implantation in the step of FIG. 6C, the surface of the p-type silicon substrate 1 other than the surface below the silicon nitride film 3 is thermally oxidized in the step shown in FIG. 6D, and silicon oxide films 5 grow as so-called LOCOS element isolation. The silicon oxide films 5 demarcate an active element area on the p-type silicon substrate 1.

Figure 6E:
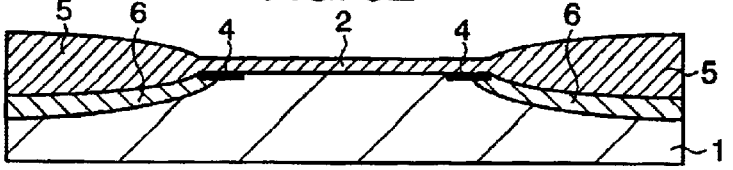

As shown in FIG. 6E, the p-type silicon substrate 1 is dipped in a phosphoric acid solution at a temperature of about 150° C., dissolving and removing the silicon nitride film 3. The silicon nitride films 4 formed below the silicon nitride film 3 are not removed by phosphoric acid and remain below the silicon oxide film 2 because the upper surfaces of the silicon nitride films 4 are covered and protected by the silicon oxide film 2.

Figure 6F:
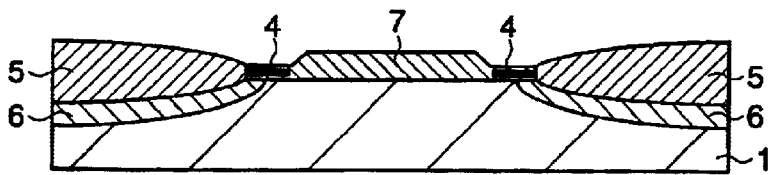

As shown in FIG. 6F, the silicon oxide film 2 on the p-type silicon substrate 1 is removed by being dipped in a hydrofluoric acid (HF) solution. The p-type silicon substrate 1 is thermally oxidized to form a silicon oxide film 7 as a gate insulating film to a film thickness of about 15 nm. At the portion where the silicon nitride film 4 is formed, the silicon nitride film 4 decreases the oxidation speed of thermal oxidation. Thus, the silicon oxide film 7 at this portion is formed thinner than in the remaining area. By this thermal oxidation, the silicon nitride films 4 are covered with the silicon oxide film 7. A gate insulating film with a structure including the silicon nitride films 4 in the silicon oxide film 7 is formed on the p-type silicon substrate 1 near the pair of diffused layers 6.

The silicon nitride film 4 exhibits a high carrier trap characteristic than that of the silicon oxide film 7. Since the silicon nitride film 4 is included in part of the silicon oxide film 7 functioning as a gate insulating film, similar to the first embodiment, the carrier trap characteristic at this portion can be improved in comparison with the remaining area of the silicon oxide film 7. In an area where no silicon nitride film 4 is formed, the silicon oxide film 7 is made thicker than in the area where the silicon nitride film 4 is formed. This suppresses carrier trap in the gate oxide film 7 when a voltage is applied to a gate electrode formed on the top. Hence, the carrier trap characteristic becomes higher at the end of the channel region than near the center of the channel region.

Figure 6G:
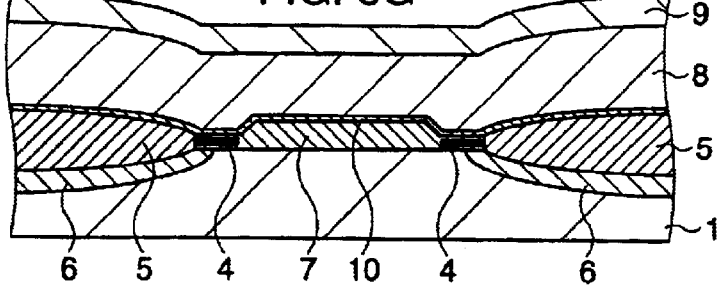

As shown in FIG. 6G, a silicon nitride film 10 is formed to a film thickness of about 6 nm by CVD on the silicon oxide films 7 and 5. A trap film with a multilayered structure of the silicon oxide film 7, silicon nitride film 4, silicon oxide film 7, and silicon nitride film 10 is formed near each diffused layer 6. By forming the two silicon nitride films as a charge trap film, the carrier trap characteristic near the diffused layers 6 can be further improved.

Then, a polysilicon film 8 in which phosphorus (P) is introduced by CVD is formed on the entire surface of the p-type silicon substrate 1. A tungsten silicide film 9 is deposited to a film thickness of about 100 nm on the polysilicon film 8 by CVD. The polysilicon film 8 and tungsten silicide film 9 are patterned into a gate electrode shape by photolithography and subsequent dry etching. Accordingly, a gate electrode with a polycide structure of the polysilicon film 8 and tungsten silicide film 9 is formed. By these steps, the source/drain diffused layers (diffused layers 6), gate insulating film (silicon oxide film 7, and silicon nitride films 4 and 10), and gate electrode (polysilicon film 8 and tungsten silicide film 9) are completed as the main part of a transistor.

Thereafter, a general wiring layer formation step is performed to complete a nonvolatile semiconductor memory according to the third embodiment. More specifically, an insulating interlayer (silicon oxide film or the like) is deposited by CVD to cover the gate electrode made up of the polysilicon film 8 and tungsten silicide film 9. A contact hole is formed in the insulating interlayer by photolithography and subsequent dry etching. For example, an aluminum film is sputtered as a wiring layer on the insulating interlayer to fill the contact hole. The aluminum film is patterned into a predetermined shape by photolithography and subsequent dry etching. A protective film is so formed as to cover the aluminum film.

As described above, according to the third embodiment of the present invention, similar to the first embodiment, the silicon nitride films 4 with a high carrier trap characteristic are formed at the two ends of the gate oxide film 7. This structure limits a charge injection portion, and carriers can be surely trapped only near the silicon nitride films 4. In the third embodiment, as the silicon nitride film 10 is formed on the silicon nitride films 4, the carrier trap characteristic at the end of the silicon oxide film 7 is improved and data can be reliably recorded and erased.

(Fourth Embodiment)

The fourth embodiment of the present invention will be explained. FIGS. 7A to 7F are schematic sectional views, each of which shows the gradual step in manufacturing a nonvolatile semiconductor memory according to the fourth embodiment. The planar arrangement of the nonvolatile semiconductor memory according to the fourth embodiment is the same as that of the nonvolatile semiconductor memory according to the first embodiment shown in FIGS. 2 and 3. FIGS. 7A to 7F depict two memory cells in the nonvolatile semiconductor memory, each showing the section of the memory cell in the manufacture process order. FIGS. 7A to 7F show sectional views taken along the chain line I–I' in FIG. 3.

Figure 7A:
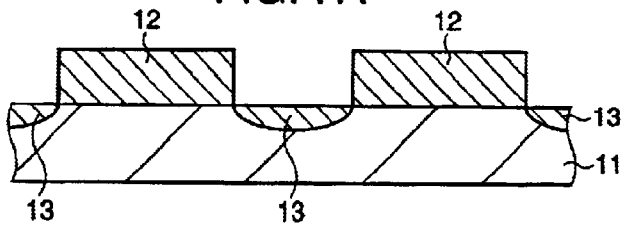
FIGS. 7A to 7F are schematic sectional views, respectively, showing the steps in manufacturing a nonvolatile semiconductor memory according to the fourth embodiment of the present invention.

As shown in FIG. 7A, a silicon nitride film 12 is deposited to a film thickness of about 150 nm to 300 nm by CVD on the major surface of a p-type silicon substrate 11 (resistivity: 1 to 12 Ωcm, containing boron (B)).

The silicon nitride film 12 is selectively removed from a prospective formation area for a bit line diffused layer by photolithography and subsequent dry etching. Ions are implanted by using the silicon nitride film 12 as a mask. More specifically, arsenic (As) as n-type impurities is ion-implanted at an acceleration energy of about 60 keV to 100 keV and a dose of $1 \times 10^{15}$ to $1 \times 10^{16}$ (ions/cm$^2$), forming a heavily doped diffused layer 13 serving as a bit line diffused layer.

Figure 7B:
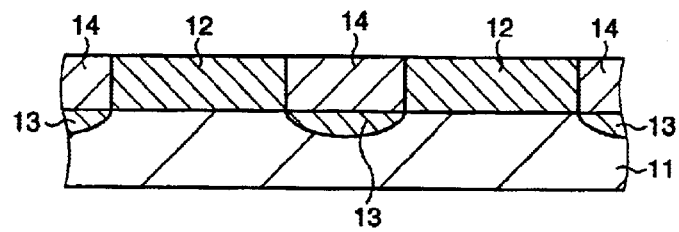

As shown in FIG. 7B, a silicon oxide film 14 is formed to a film thickness of about 300 nm to 500 nm by CVD. The silicon oxide film 14 is left only on the bit line diffused layer (diffused layer 13), and is removed from the remaining area by CMP (Chemical Mechanical Polishing) or dry etching. As a result, the surface of the silicon oxide film 14 on the diffused layer 13 becomes almost flush with the surface of the silicon nitride film 12. By the steps shown in FIGS. 7A and 7B, the diffused layer 13 and silicon oxide film 14 can be formed in self alignment by one photolithography operation.

Figure 7C:
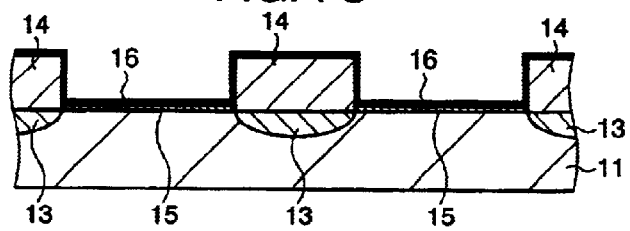

As shown in FIG. 7C, the silicon nitride film 12 is removed by wet etching using phosphorus or the like, exposing the surface of the underlying p-type silicon substrate 11. The p-type silicon substrate 11 is thermally oxidized to form a silicon oxide film 15 having a film thickness of about 10 nm to 30 nm on the surface of the p-type silicon substrate 11 that has been exposed by removing the silicon nitride film 12. A silicon nitride film 16 serving as a carrier trap film is deposited to a film thickness of about 10 nm to 20 nm by CVD on the silicon oxide films 14 and 15.

Figure 7D:
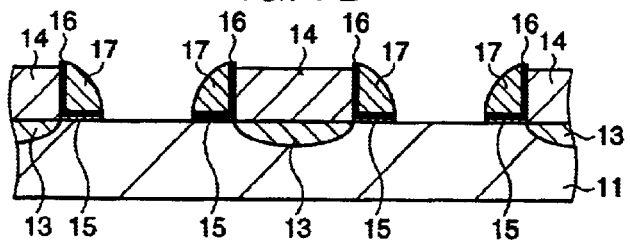

As shown in FIG. 7D, e.g., a silicon oxide film 17 is deposited to a film thickness of about 300 nm to 500 nm by CVD, and removed by dry etching so as to remain only on the side walls of the silicon oxide film 14. As a result, a side wall made up of the silicon oxide film 17 and silicon nitride film 16 is formed on each side wall of the silicon oxide film 14. By this dry etching, the silicon nitride film 16 and silicon oxide film 15 between side walls are removed to expose the surface of the p-type silicon substrate 11.

Figure 7E:
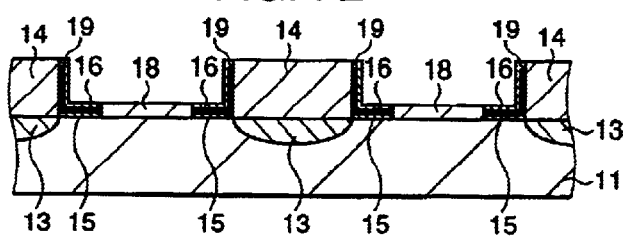

As shown in FIG. 7E, the surface of the p-type silicon substrate 11 is thermally oxidized at a temperature of about 800 to 900° C. for about 30 to 90 min, thereby forming a silicon oxide film 18 on the surface of the p-type silicon substrate 11. The silicon oxide film 17 is removed by wet etching, and the surface of the silicon nitride film 16 is thermally oxidized to form a silicon oxide film 19. If the silicon oxide film 17 contains impurities (boron or phosphorus) in advance, the silicon oxide films 17 and 14 can attain different etching rates. The silicon oxide film 17 can be removed while the removal amount of the silicon oxide film 14 is minimized. Since the silicon oxide film 18 is formed by thermal oxidation, it has a different etching rate as that of the silicon oxide film 17, and the removal amount of the silicon oxide film 18 can be minimized. The silicon oxide film 17 may be replaced by another insulating film having an etching rate different from those of the silicon oxide films 14 and 18.

Hence, the lower and upper surfaces of the silicon nitride films 16 are respectively covered with the silicon oxide films 15 and 19 on the p-type silicon substrate 11 at the two sides of the silicon oxide film 18, thus forming a gate insulating film. Since each silicon nitride film 16 is covered with the silicon oxide film 17 in thermal oxidation for forming the silicon oxide film 18, the film thickness of the silicon oxide film 18 can be independently controlled.

The silicon oxide films 18 and 19 may be simultaneously formed after the silicon oxide film 17 is removed by wet etching. In this case, the oxidization speed of thermal oxidization decreases near the silicon nitride film 16, so that the silicon oxide film 19 is formed thinner than the silicon oxide film 18.

Figure 7F:
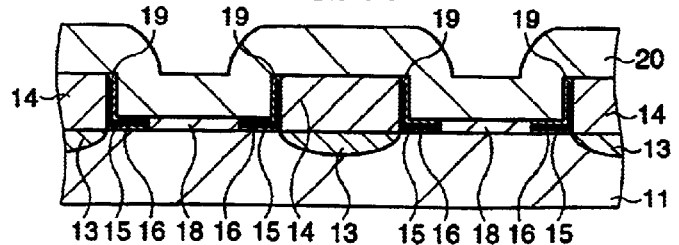
Figure 8:
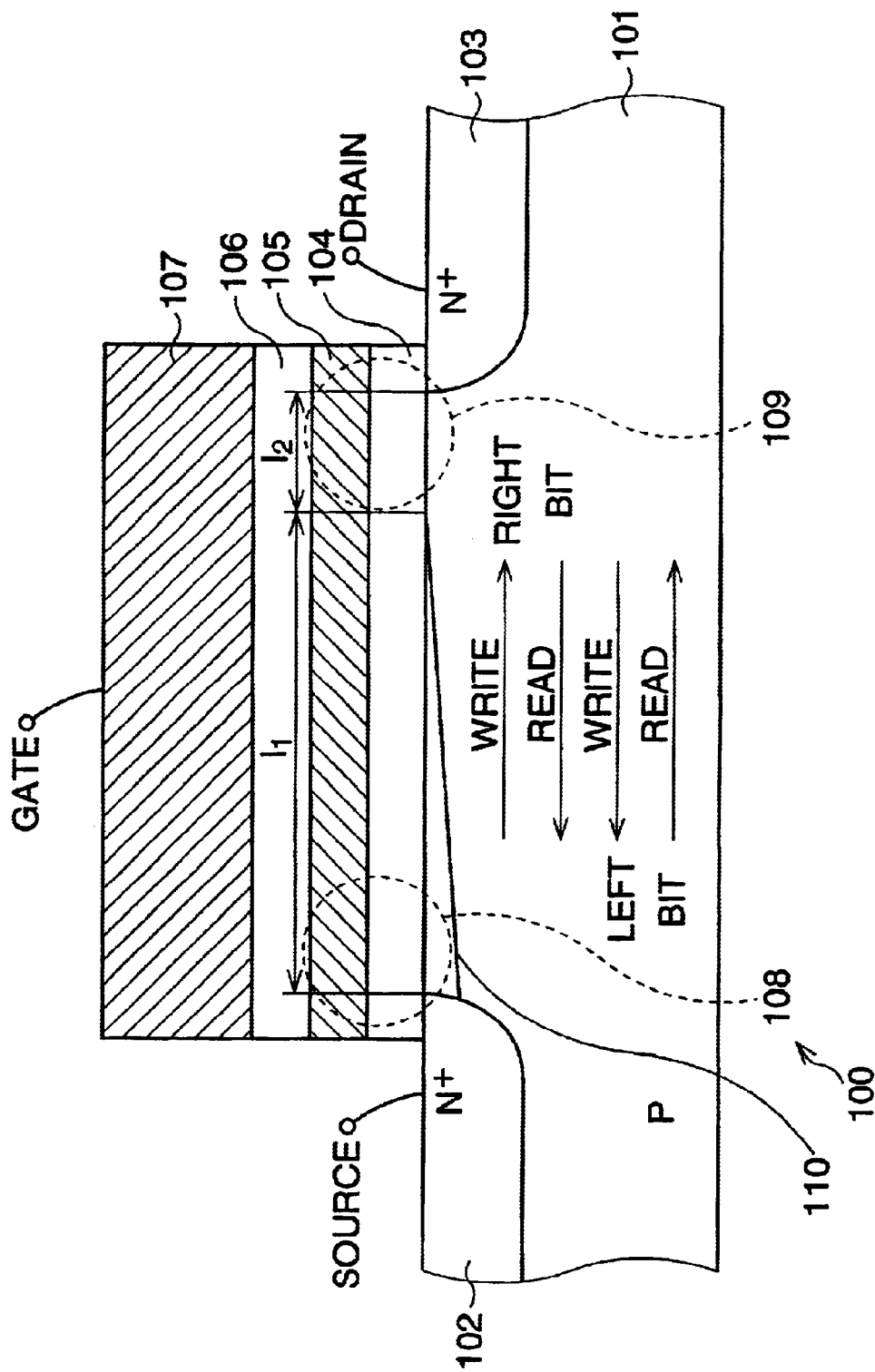
FIG. 8 is a schematic sectional view showing the structure of a conventional nonvolatile semiconductor memory.

As shown in FIG. 7F, a polysilicon film 20 in which phosphorus (P) is introduced at about $2 \times 10^{20}$ to $6 \times 10^{20}$ (atms/cm$^3$) is deposited to a film thickness of about 100 nm to 200 nm by CVD, and patterned into a word line shape by photolithography and dry etching.

Thereafter, the diffused layer in the p-type silicon substrate 11 is activated by annealing, an insulating interlayer is formed, a contact hole is formed, and a metal wiring layer is formed, completing a nonvolatile semiconductor memory according to the fourth embodiment.

As described above, according to the fourth embodiment of the present invention, similar to the first embodiment, the silicon nitride films 15 with a high carrier trap characteristic are formed at the two ends of the gate oxide film 18. This structure limits a charge injection portion, and carriers can be reliably trapped only near the silicon nitride films 15. According to the fourth embodiment, the diffused layer 13 and silicon oxide film 14 on the diffused layer 13 can be formed in self alignment by one photolithography operation. A gate insulating film made up of the silicon oxide films 15, 18, and 19 and the silicon nitride film 16 can be formed between two adjacent diffused layers 13 with high precision. In forming the silicon oxide film 18, the silicon nitride film 16 is covered with the silicon oxide film 17 serving as a side wall. The film thickness of the silicon oxide film 18 can be independently formed with high precision.

Write, erase, and read of data with respect to the nonvolatile semiconductor memory according to the second to fourth embodiments described above are the same as those in the first embodiment shown in FIGS. 4A and 4B.

In the above embodiments, a silicon nitride film is used as a carrier trap film, and the carrier trap characteristic at the portion where the silicon nitride film is formed is enhanced. However, the present invention is not limited to this, and includes all arrangements for locally enhancing the carrier trap characteristic at the end of the channel region in addition to the use of another insulating film.

Industrial Applicability

As has been described above, the present invention relates to a semiconductor memory which comprises a pair of diffused layers formed in the surface area of a semiconductor substrate, and a gate electrode formed on a gate insulating film on the semiconductor substrate between the pair of diffused layers, and which captures carriers in the gate insulating film by applying a predetermined voltage to the gate electrode. The carrier trap characteristic of the gate insulating film at positions near the pair of diffused layers is made higher than in the remaining area. The carrier injection position can be changed to stably, reliably record and store 2-bit information. Therefore, the present invention can provide a semiconductor memory and a method of manufacture thereof that can suppress generation of a write/erase error and improve reliability in a nonvolatile semiconductor memory capable of recording 2-bit information in one memory cell.

What is claimed is:

1. A semiconductor memory comprising:
    a pair of diffused layers formed in a surface area of a semiconductor substrate; and
    a gate electrode formed on a gate insulating film on the semiconductor substrate between said pair of diffused layers, so that carriers are trapped in the gate insulating film by applying a predetermined voltage to said gate electrode, thereby 2-bit information is capable of being recorded, and wherein
    the gate insulating film is formed higher in carrier trap characteristic at positions near said pair of diffused layers than in a remaining area.

2. A semiconductor memory according to claim 1, wherein a charge trap film higher in carrier trap characteristic than said gate insulating film is formed in said gate insulating film at the positions near said pair of diffused layers.

3. A semiconductor memory according to claim 2, wherein said gate insulating film is formed thinner at the positions near said pair of diffused layers than in the remaining area.

4. A semiconductor memory according to claim 1, wherein said gate insulating film is formed smaller in film thickness in electrical capacitance conversion at the positions near said pair of diffused layers than in the remaining area.

5. A semiconductor memory according to claim 2, wherein another charge trap film is formed on said gate insulating film, and said gate electrode is formed on said other charge trap him on said gate insulating film.

6. A semiconductor memory comprising:
- a pair of diffused layers formed in a surface area of a semiconductor substrate; and
- a gate electrode formed on a gate insulating film on the semiconductor substrate between said pair of diffused layers, so that carriers are trapped in the gate insulating film by applying a predetermined voltage to said gate electrode, and wherein the gate insulating film is formed higher in carrier trap characteristic at positions near said pair of diffused layers than in a remaining area, a charge trap film higher in carrier trap characteristic than said gate insulating film is formed in said gate insulating film at the positions near said pair of diffused layers, and another charge trap film is formed on said gate insulating film, and said gate electrode is formed on said other charge trap film on said gate insulating film.

* * * * *